(12) United States Patent  
Kimura (10) Patent No.: US 9,245,864 B2  
(45) Date of Patent: Jan. 26, 2016

(54) BALL GRID ARRAY SEMICONDUCTOR PACKAGE AND METHOD OF MANUFACTURING THE SAME

(71) Applicant: SEIKO INSTRUMENTS INC., Chiba-shi, Chiba (JP)

(72) Inventor: Noriyuki Kimura, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/595,476

(22) Filed: Jan. 13, 2015

(65) Prior Publication Data

US 2015/0123277 A1 May 7, 2015

Related U.S. Application Data

(62) Division of application No. 13/200,246, filed on Sep. 21, 2011, now Pat. No. 8,940,629.

(30) Foreign Application Priority Data

Sep. 22, 2010 (JP) .................................. 2010-212555

(51) Int. Cl.
*H01L 23/48* (2006.01)
*H01L 23/00* (2006.01)
(Continued)

(52) U.S. Cl.
CPC ............. *H01L 24/14* (2013.01); *H01L 21/565* (2013.01); *H01L 23/31* (2013.01); *H01L 23/49816* (2013.01); *H01L 23/49827* (2013.01); *H01L 24/48* (2013.01); *H01L 24/49* (2013.01); *H01L 24/97* (2013.01); *H01L 23/3107* (2013.01); *H01L 24/45* (2013.01); *H01L 2224/141* (2013.01); *H01L 2224/45015* (2013.01); *H01L 2224/45124* (2013.01); *H01L 2224/45144* (2013.01); *H01L 2224/45147* (2013.01); *H01L 2224/4848* (2013.01); *H01L 2224/48091* (2013.01); *H01L 2224/48227* (2013.01); *H01L 2224/48229* (2013.01); *H01L 2224/48465* (2013.01); *H01L 2224/49171* (2013.01);
(Continued)

(58) Field of Classification Search
CPC ................. H01L 2924/00; H01L 2224/32225; H01L 2224/16225; H01L 2224/73204; H01L 2924/15311; H01L 24/14
USPC .......................................... 257/738, E24.599
See application file for complete search history.

(56) References Cited

U.S. PATENT DOCUMENTS

| 5,241,133 A | 8/1993 | Mullen, III et al. .......... 174/52.4 |
| 5,950,070 A | 9/1999 | Razon et al. ................... 438/113 |

(Continued)

FOREIGN PATENT DOCUMENTS

JP        07193162        7/1995

*Primary Examiner* — Yosef Gebreyesus
(74) *Attorney, Agent, or Firm* — Adams & Wilks (57) ABSTRACT

A BGA semiconductor package includes a semiconductor device adhered by adhesive to a substrate, and a conductive micro ball fitted into a through-hole provided in the substrate. A bonding wire electrically connects the semiconductor device and the micro ball to each other. An encapsulation member made of resin encapsulates the semiconductor device, the adhesive, part of the micro ball, and the bonding wire, only on a surface side of the substrate on which the semiconductor device is mounted. At least a part of a bottom surface of the micro ball has an exposed portion as an external connection terminal, which is exposed through the through-hole provided in the substrate as a bottom surface of the encapsulation member.

13 Claims, 7 Drawing Sheets

(51) Int. Cl.
  *H01L 21/56* (2006.01)
  *H01L 23/498* (2006.01)
  *H01L 23/31* (2006.01)

(52) U.S. Cl.
  CPC .. *H01L 2224/92247* (2013.01); *H01L 2224/97* (2013.01); *H01L 2924/014* (2013.01); *H01L 2924/01005* (2013.01); *H01L 2924/01006* (2013.01); *H01L 2924/01013* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/07802* (2013.01); *H01L 2924/09701* (2013.01); *H01L 2924/15788* (2013.01); *H01L 2924/181* (2013.01); *H01L 2924/1905* (2013.01); *H01L 2924/384* (2013.01)

(56) References Cited

U.S. PATENT DOCUMENTS

| | | | |
|---|---|---|---|
| 5,990,545 A | 11/1999 | Schueller et al. | 257/697 |
| 5,994,773 A * | 11/1999 | Hirakawa | H01L 21/486 257/668 |
| 6,066,512 A | 5/2000 | Hashimoto | 438/112 |
| 6,097,610 A * | 8/2000 | Hashimoto | H01L 21/486 174/255 |
| 6,160,313 A * | 12/2000 | Takashima | H01L 23/49838 257/737 |
| 6,329,228 B1 * | 12/2001 | Terashima | H01L 21/486 257/675 |
| 6,395,578 B1 | 5/2002 | Shin et al. | 438/106 |
| 6,400,574 B1 | 6/2002 | Stephenson et al. | 361/760 |
| 6,498,099 B1 * | 12/2002 | McLellan | H01L 21/4832 257/E23.043 |
| 6,528,874 B1 | 3/2003 | Iijima et al. | 257/700 |
| 8,703,532 B2 | 4/2014 | Kimura | 438/106 |
| 2002/0106832 A1 | 8/2002 | Hotchkiss et al. | 438/108 |
| 2004/0000707 A1 | 1/2004 | Roper et al. | 257/686 |
| 2004/0072389 A1 | 4/2004 | Chen et al. | 438/127 |
| 2004/0097081 A1 * | 5/2004 | Igarashi | H01L 21/561 438/689 |
| 2005/0041403 A1 | 2/2005 | Cady et al. | 361/749 |
| 2005/0214980 A1 | 9/2005 | Shiu et al. | 438/123 |
| 2006/0108666 A1 * | 5/2006 | Koizumi | H01L 23/3171 257/621 |
| 2007/0164457 A1 * | 7/2007 | Yamaguchi | H01L 23/5389 257/787 |
| 2008/0032457 A1 | 2/2008 | McWilliams et al. | 438/125 |
| 2008/0044948 A1 | 2/2008 | Kimura | 438/114 |
| 2008/0196226 A1 | 8/2008 | Aoya | 29/25.01 |
| 2009/0081867 A1 | 3/2009 | Taguchi et al. | 438/675 |
| 2010/0122840 A1 | 5/2010 | Asai et al. | 174/258 |
| 2010/0295167 A1 * | 11/2010 | Watanabe | H01L 24/97 257/693 |
| 2011/0079902 A1 * | 4/2011 | Sakamoto | H01L 21/563 257/738 |
| 2012/0126418 A1 * | 5/2012 | Feng | H01L 21/563 257/774 |

* cited by examiner

BALL GRID ARRAY SEMICONDUCTOR PACKAGE AND METHOD OF MANUFACTURING THE SAME

BACKGROUND OF THE INVENTION

1. Field of the Invention

The present invention relates to structure of a ball grid array (BGA) semiconductor package and a method of manufacturing the same.

2. Description of the Related Art

Along with the needs of reduction in size and weight and improvement in function of electronic devices, high density mounting of semiconductor parts into the electronic devices is demanded, and in recent years, there have been required smaller and thinner semiconductor packages suitable for high integration.

In the context of such a trend, various types of semiconductor packages are proposed in response to various applications, such as gull-wing, leadless, BGA, and wafer level. Further, under recent economic environment in which reduction in product price is desired, those semiconductor packages should be provided at a cheaper price together with features in small size and high integration.

Figure 8:
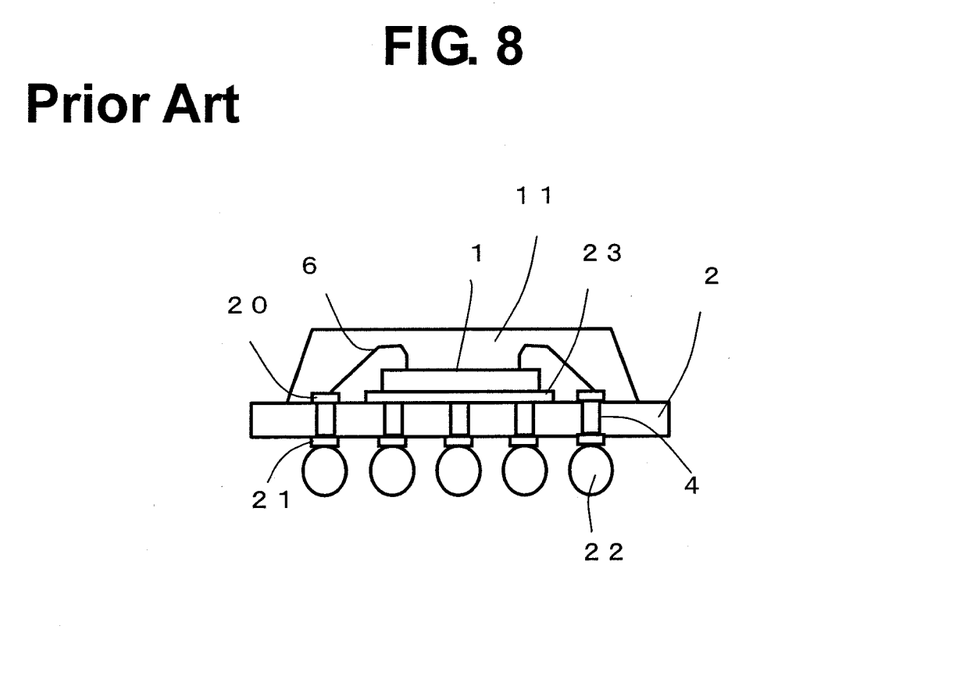
FIG. 8 is a cross-sectional view illustrating a conventional BGA semiconductor package.

In a semiconductor package belonging to a BGA type to which the present invention relates, as illustrated in FIG. 8, the following configuration is provided. That is, the semiconductor package includes: a semiconductor device 1; an adhesive for mounting the semiconductor device 1 to a die pad 23 which is disposed on the substrate 2; bonding wires 6 for connecting the semiconductor device 1 and a plurality of metal lines 20 provided on the substrate 2 to each other; and an encapsulation resin 11 for encapsulating the semiconductor device 1, the adhesive, the bonding wires 6, and the plurality of metal lines 20. On the other surface of the substrate 2, solder balls 22 are formed as external terminals on each of an external connection portion 21. For the substrate 2, a heat-resistant substrate typified by a bismaleimide resin (BT resin) is used. The die pad 23 mounting the semiconductor device 1 and the plurality of metal lines 20 are formed on one surface of the substrate, and the external connection portion 21 is formed on the other surface of the substrate. Via throughholes 4 provided in the substrate 2, each of which is coated with a conduction layer, the respective surfaces are connected to each other. The solder balls 22, which electrically and physically connect the semiconductor encapsulation member and a mounting substrate to each other, are mounted on the external connection portion 21 in a lattice or zigzag arrangement. For example, Japanese Published Patent Application No. 07-193162 and U.S. Pat. No. 5,241,133 disclose such structure.

As described above, in a conventional BGA semiconductor package, unlike a semiconductor package using a metal lead frame, there is used a double-sided substrate or a multilayer wiring substrate, which uses a heat-resistant resin as a base, and hence steps of forming the substrate become complicated. For example, when the substrate is manufactured, it is necessary to manufacture a mask for circuit formation, for forming the wiring on the mounting surface side on which the semiconductor device is mounted and forming the external connection terminal on the other side. In addition, during the formation of the substrate, it is necessary to carry out resist coating, exposure and development, resist patterning, forming of the through-hole and plating for electrically connecting the metal lines and the external connection terminals to each other, resist removal processing, and adhesion of the substrates. Accordingly, there has been a problem that the unit price per one substrate becomes more expensive than that in a case where the metal lead frame is used, and the total package cost becomes high.

Further, in the conventional BGA semiconductor package, as the external connection terminal for connection to the mounting substrate, the solder ball is formed and mounted on the substrate. As a formation method therefor, a method is employed in which a minute amount of solder paste or flux is applied to an external connection region of the substrate, and the solder ball is adhered to be connected. In the above-mentioned method, when fluctuations are generated in the application amount of the solder paste or flux, fluctuations in contact area between the solder ball and the external connection region are generated. In a case where the contact area decreases, there has been a problem that the connection strength of the solder ball reduces, which causes defects of the solder ball such as misalignment, formation failure, and drop off, by external vibration or impact.

Further, as described above, in the conventional BGA semiconductor package, the solder ball is formed and mounted on the external connection terminal, and hence the entire thickness of the semiconductor package is increased by the height of the solder ball, and hence there has been a disadvantage that the thinning of the semiconductor package is disturbed.

SUMMARY OF THE INVENTION

The present invention has an object to solve the above-mentioned three problems. First, a simple substrate is used, which does not use a double-sided or multilayer substrate used in a conventional BGA semiconductor package, and hence it is possible to manufacture cheap packages. Second, a BGA semiconductor package according to the present invention has structure in which a part of an external connection terminal is buried into an encapsulation member, and hence the encapsulation member and the external connection terminal are firmly connected to each other, and the connection strength of the external connection terminal can be increased. Third, the BGA semiconductor package according to the present invention has structure in which a part of the external connection terminal is buried into the encapsulation member of the package, and hence the package can be formed thinner by an amount that the external connection terminal is buried in the encapsulation member of the package.

As described above, the present invention provides a semiconductor package and a method of manufacturing the same, which are provided to solve the above-mentioned problems of the conventional BGA semiconductor package.

The above-mentioned problems may be solved by the following measures.

A BGA semiconductor package according to the present invention includes: a semiconductor device; a substrate on which the semiconductor device is mounted; an adhesive for adhering the semiconductor device and the substrate to each other; a micro ball having conductivity, the micro ball being fitted into a through-hole provided in the substrate; a bonding wire for electrically connecting the semiconductor device and the micro ball to each other; and an encapsulation member for encapsulating, with an encapsulation resin, the semiconductor device, the adhesive, a part of the micro ball, and the bonding wire, only on a surface side of the substrate on which the semiconductor device is mounted, in which at least a part of a bottom surface of the micro ball has an exposed portion as an external connection terminal, which is exposed through the through-hole provided in the substrate from a bottom surface of the encapsulation member.

The substrate may be made of an insulator of any one of a resin, a glass epoxy, a ceramics, and a glass. In the substrate, the plurality of through-holes each having a cylindrical shape may be formed.

The through-hole provided in the substrate may have a diameter smaller than a diameter of the micro ball, and the substrate may have a thickness smaller than the diameter of the micro ball.

The plurality of through-holes provided in the substrate into which the micro balls are inserted may be formed in one of a peripheral arrangement and an array (area) arrangement at the bottom surface of the encapsulation member.

The through-hole provided in the substrate may have an end surface subjected to one of chamfering and tapering.

A material of the micro ball may include one of a single metal material such as solder, gold, silver, copper, aluminum, palladium, and nickel and a multilayer metal material of metals such as solder, gold, silver, copper, aluminum, palladium, and nickel.

A center portion (core) of the micro ball may be formed of a resin material having elasticity, and the micro ball may be one of a composite micro ball in which an outer periphery portion of the resin material having the elasticity is covered with a single metal material such as solder, gold, silver, copper, aluminum, palladium, and nickel and a composite micro ball in which the outer periphery portion of the resin material having the elasticity is covered with a multilayer metal material of metals such as solder, gold, silver, copper, aluminum, palladium, and nickel.

The micro ball may have an upper surface height higher than an upper surface of the semiconductor device fixed to a die pad.

The micro ball may have an upper surface height lower than an upper surface of the semiconductor device fixed to a die pad.

The bonding wire may be made of any one of metal wires including a gold wire, a copper wire, and an aluminum wire.

The micro ball may have a diameter which is 5 µm or larger and 500 µm or smaller.

A method of manufacturing a BGA semiconductor package according to the present invention includes: forming a plurality of through-holes in a substrate; mounting micro balls on the substrate in which the plurality of through-holes are formed; bonding the semiconductor device on a die pad portion provided in a region excluding the plurality of through-holes, the region being provided on a side on which the micro balls are mounted; electrically connecting the semiconductor device and the micro balls by bonding wires; integrally encapsulating the semiconductor device, the die pad portion, the bonding wires, and parts of the micro balls with an encapsulation resin, to thereby form an encapsulation member; and cutting the encapsulation member into individual pieces of BGA semiconductor packages.

The forming of the plurality of through-holes provided in the substrate may be carried out by any one of a drill process, a laser process, a pattern etching process, and a pressing process using a mold.

In the mounting of the micro balls in the plurality of through-holes of the substrate, the mounting of the micro balls may be carried out by any one of a mounting method, a suction method, and a substrate vibrating method.

In the electrically connecting of the semiconductor device and the micro balls by the bonding wires, the electrically connecting may be carried out by a wire bonding method under a state in which the micro balls are fixed to the through-holes of the substrate by any one of suction fixing, press fixing, fixing using an adhesive, fusion-bonding of a metal, ultrasonic bonding, and thermosonic bonding.

The resin encapsulating of a structure obtained after the wire bonding only on the upper surface side of the substrate may be carried out by one of a transfer molding method and a potting method.

The cutting of the resin encapsulation member obtained after the resin encapsulation into the individual pieces may be carried out by a dicing method.

With the measures described above, the double-sided substrate or the multilayer substrate used in the conventional BGA semiconductor package is not required to be used, and hence steps of manufacturing the substrate are simplified, and unit price per one substrate is reduced, which makes it possible to manufacture a cheap package.

Further, the BGA semiconductor package according to the present invention has a feature that a part of the ball for external connection is buried in the encapsulation member. Since the encapsulation member of the package holds the main volume part of the micro ball for external connection, firm connection between the encapsulation member and the micro ball for external is made.

Still further, because the part of the ball for external connection is buried in the encapsulation member, the thickness of the package is reduced by the buried amount, and hence it is possible to achieve a thin package as a whole.

DETAILED DESCRIPTION OF THE PREFERRED EMBODIMENT

Hereinafter, a BGA semiconductor package according to an embodiment of the present invention is described.

Figure 1A:
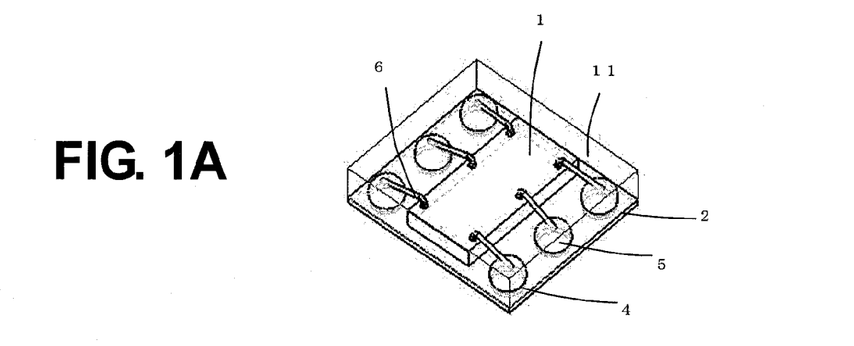
FIGS. 1A to 1D are views illustrating structure of a BGA semiconductor package according to an embodiment of the present invention.
Figure 1B:
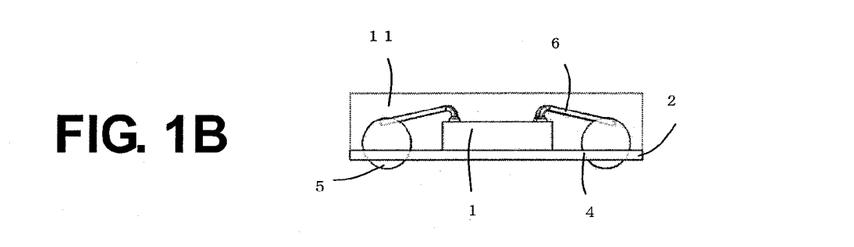
Figure 1C:
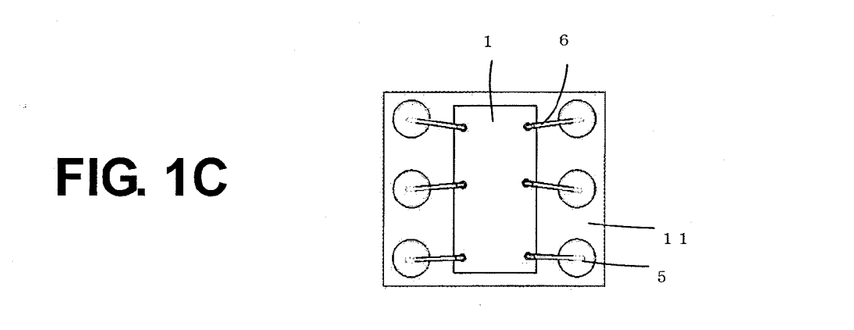
Figure 1D:
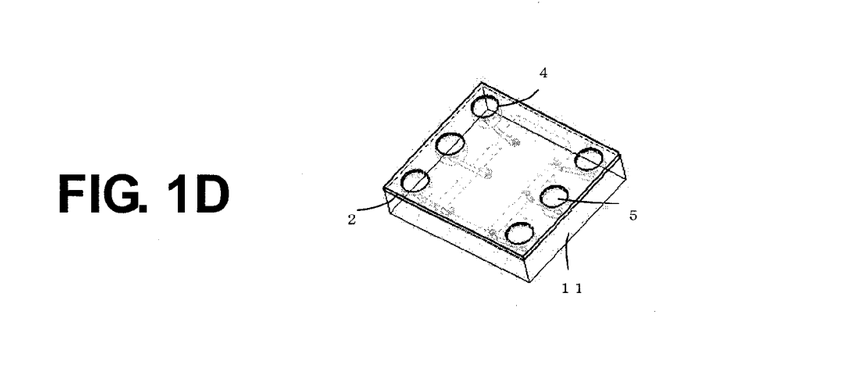

FIGS. 1A to 1D are views illustrating an example of the BGA semiconductor package according to the embodiment of the present invention, in which FIG. 1A is a perspective view illustrating schematic structure viewing an encapsulation member from an encapsulation resin side, FIG. 1B is a side view, and FIG. 1C is a top view. FIG. 1D is a perspective view viewing the encapsulation member from an external terminal side.

As illustrated in FIGS. 1A to 1D, the BGA semiconductor package of this embodiment is a 6-pin semiconductor package including six external connection terminals. As illustrated in FIGS. 1A to 1D, the BGA semiconductor package includes a semiconductor device 1, a substrate 2 which mounts the semiconductor device 1, an adhesive (not shown) adhering the semiconductor device 1 to the substrate 2, conductive micro balls 5 which are fitted into through-holes 4 provided in the substrate 2, bonding wires 6 for electrically connecting the semiconductor device 1 and the micro balls 5 to each other, and the encapsulation member for encapsulating, with an encapsulation resin 11, the semiconductor device 1, the adhesive 3, parts of the micro balls 5, and the bonding wires 6, only on the semiconductor device 1 side of the substrate 2. As illustrated in FIG. 1B, at least a part of a bottom surface of each of the micro balls 5 has an exposed portion as an external connection terminal, which is exposed from a bottom surface of the encapsulation member through the through-hole 4 provided in the substrate 2.

As illustrated in FIGS. 1A and 1B, in the BGA semiconductor package according to this embodiment, the micro ball 5 has both roles as internal connection wiring to the semiconductor device 1 inside the encapsulation member, and the external connection terminal to be used for connection to a mounting substrate.

Next, the BGA semiconductor package according to this embodiment is described by means of a specific example of dimensions. For example, the semiconductor device having a thickness of 150 μm is fixed to a die pad region provided in a center position of the six external connection terminals formed on the glass substrate 2 having a thickness of 0.2 mm by an insulating adhesive. Here, mounting pitches L of the external connection terminals are set to 0.5 mm, a diameter of the through-hole is set to 0.22 mm, and a diameter of the micro ball 5 is set to 0.25 mm. Here, the bonding wire 6 electrically connecting the semiconductor device 1 and the micro ball 5 to each other is a gold wire having a diameter of 20 μm.

The micro ball 5 used in this embodiment is a ball, which is obtained by nickel-plating a surface of a plastic particle followed by gold-plating (refer to SEKISUI CHEMICAL CO., LTD.: Micropearl (registered trademark)). In this embodiment, there is employed a downward wiring structure in which the height of the upper surface portion of the semiconductor device 1 is set to be higher than that of the upper surface portion of the micro ball 5. Note that, depending on required dimensions and a constraint about a loop height of the bonding wire, the height of the upper surface portion of the semiconductor device 1 may be set to be lower than that of the upper surface portion of the micro ball 5, to thereby take a wiring mode in which the wiring is upward from the semiconductor device 1 to the micro ball 5. The upward wiring structure can be achieved by adjusting the mutual dimension relationship between the diameter length of the micro ball 5 and the diameter length of the through-hole 4 provided in the substrate 2, that is, satisfying the diameter of the micro ball 5>>the diameter of the through-hole 4. Further, the upward wiring structure can also be achieved by reducing the thickness of the semiconductor device 1 without changing the mutual dimension between the diameter of the micro ball 5 and the diameter of the through-hole 4 provided in the substrate 2. By setting a connection point of a second bonding to be connected to the micro ball 5 to an apex of the upper surface portion of the micro ball 5, the pressing force for the bonding becomes stable, which makes it possible to ensure further connection reliability.

Figure 2A:
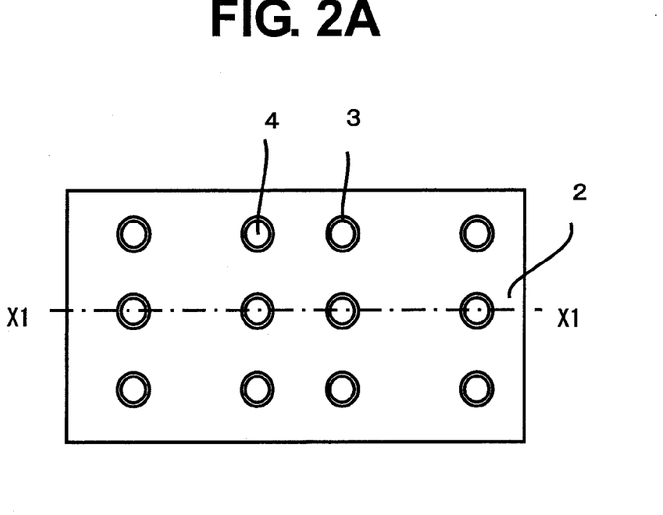
FIGS. 2A to 2C are views illustrating steps of a method of manufacturing the BGA semiconductor package according to the embodiment of the present invention.
Figure 2B:
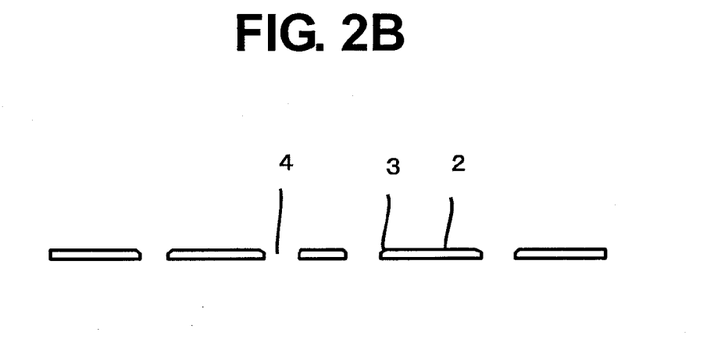

Next, a method of manufacturing a BGA semiconductor package according to the embodiment of the present invention is described in each step with reference to the drawings. FIGS. 2A and 6 are top views, and FIGS. 2B and 2C, 3A to 3C, 4, 5A to 5C, and 7 are cross-sectional views taken along the line X1-X1 of FIG. 2A. FIGS. 2A and 2B are a top view and a cross-sectional view of the substrate 2, respectively. The through-holes 4 are formed in the substrate 2. For example, in the case of this embodiment, a plurality of cylindrical through-holes of 0.22 mm are formed in 0.5 mm pitch in a glass epoxy substrate having a length of 70 mm, a width of 200 mm, and a thickness of 0.2 mm by a drill process. The through-holes are disposed so as to be arranged on both sides of the semiconductor device. In the upper surface portion of each of the through-holes 4, a tapered portion 3 is formed so as to facilitate the mounting of the micro ball 5 into the through-hole 4. The substrate 2 may be made of a ceramics or a glass. The through-holes can also be made by a laser process, a pattern etching process, or a pressing process using a mold.

Figure 2C:
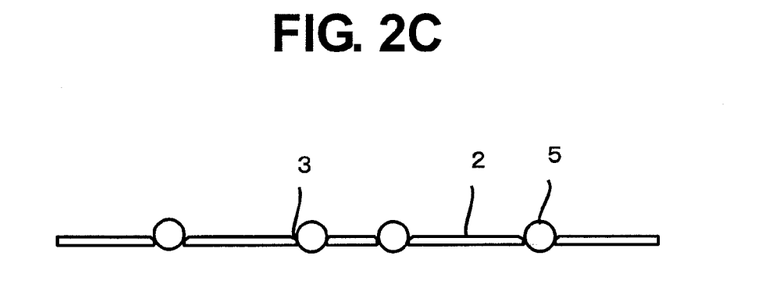

Next, as illustrated in FIG. 2C, the micro balls 5 are mounted in the through-holes 4 formed in the substrate 2 by a ball mounting method. Alternatively, a vibrating method may be employed, which causes the substrate 2 to vibrate, to thereby mount the micro balls 5 in the through-holes 4. The micro ball 5 used in this embodiment is formed using a resin material having elasticity at a center portion (core) of the micro ball, and an outer periphery portion of the resin material is covered with a single metal selected from solder, gold, silver, copper, aluminum, palladium, and the like, or a multilayer metal formed of those metals. For example, the micro ball 5 which is obtained by nickel-plating the surface of the plastic particle followed by gold-plating (refer to SEKISUI CHEMICAL CO., LTD.: Micropearl (registered trademark)) is used. Here, the micro ball 5 having a diameter of 0.25 mm is used. Note that, the micro ball 5 may be configured without using a resin material as the core, and may be configured by a single metal such as solder, gold, silver, copper, aluminum, and palladium, or may be configured by a multilayer metal in which several metal layers are formed in a multi-layered state. Though the diameter is selected to be 0.25 mm (250 micrometer), it can be selected between 5 micrometers and 500 micrometers depending on the package size, the number of pins and so on.

Next, three methods are described for fixing each of the micro balls 5 in the through-holes 4 provided in the substrate 2.

Figure 3A:
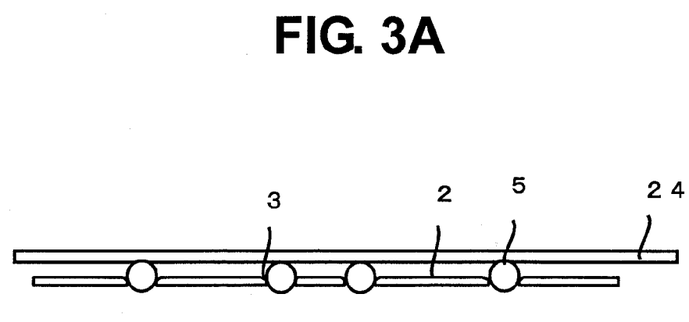
FIGS. 3A to 3C are views illustrating steps of the method of manufacturing the BGA semiconductor package according to the embodiment of the present invention, which follow the step of FIG. 2C.

First, as illustrated in FIG. 3A, after the micro balls 5 are mounted on the substrate 2, the upper surfaces of the micro balls 5 are pressed by a pressing plate 24, and the micro balls 5 are respectively fixed into the through-holes 4 using elastic deformation or plastic deformation of the micro balls 5.

Figure 3B:
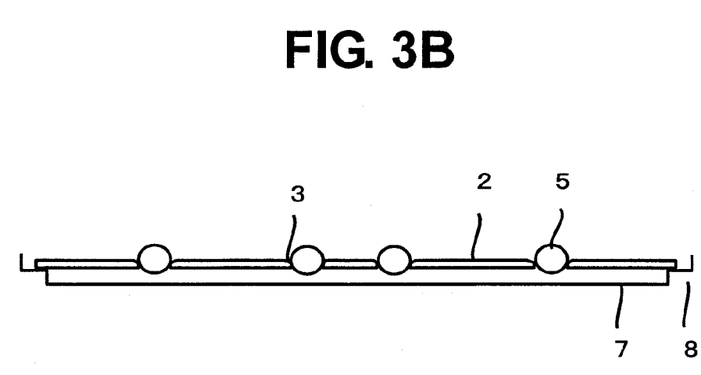

Further, as illustrated in FIG. 3B, after the micro balls 5 are mounted on the substrate 2, a suction jig 7 for sucking the micro balls 5 is attached to the lower surface side of the substrate 2, and by sucking air in the suction jig 7 from a suction hole 8, the micro balls 5 can be fixed into the through-holes 4 while maintaining the inside of the suction jig 7 to be in a negative pressure. In the manufacturing method using the suction jig 7, the suction jig 7 is attached to the substrate 2, until a die bonding step, a wire bonding step, and a resin encapsulating step following thereafter are finished.

Figure 3C:
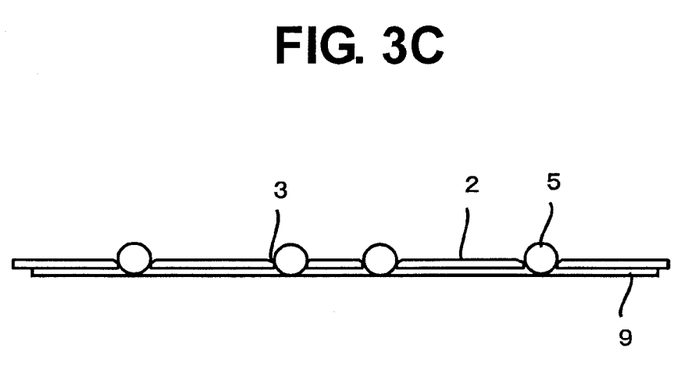

Further, as illustrated in FIG. 3C, before the micro balls 5 are mounted on the substrate 2, UV tape 9 may be adhered to the lower surface side of the substrate 2 in advance, to thereby fix the micros ball 5 into the through-holes 4 by an adhesive of the tape.

Figure 4:
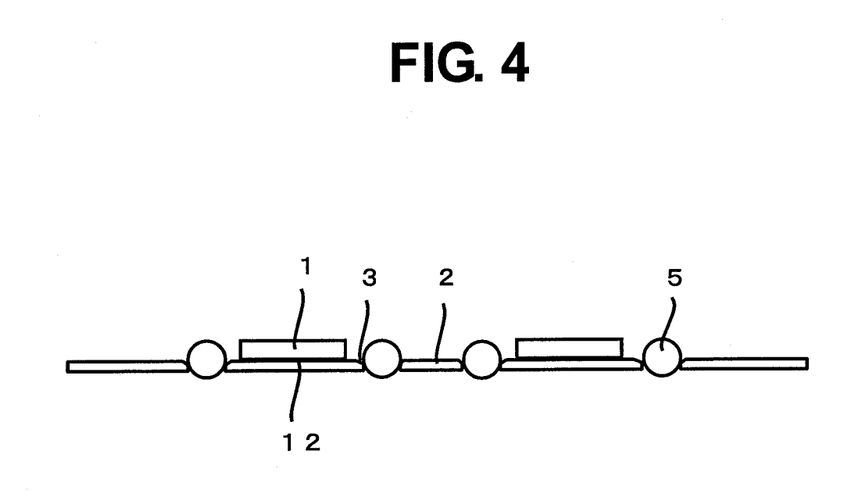
FIG. 4 is a view illustrating a step of the method of manufacturing the BGA semiconductor package according to the embodiment of the present invention, which follows the step of FIG. 3C.

Next, as illustrated in FIG. 4, the semiconductor device 1 is fixed with an insulating adhesive 12 on the substrate 2 in which the micro balls 5 are fixed.

Figure 5A:
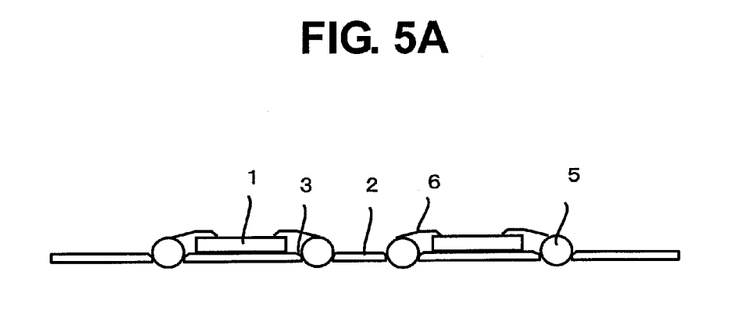
FIGS. 5A to 5C are views illustrating steps of the method of manufacturing the BGA semiconductor package according to the embodiment of the present invention, which follow the step of FIG. 4.
Figure 6:
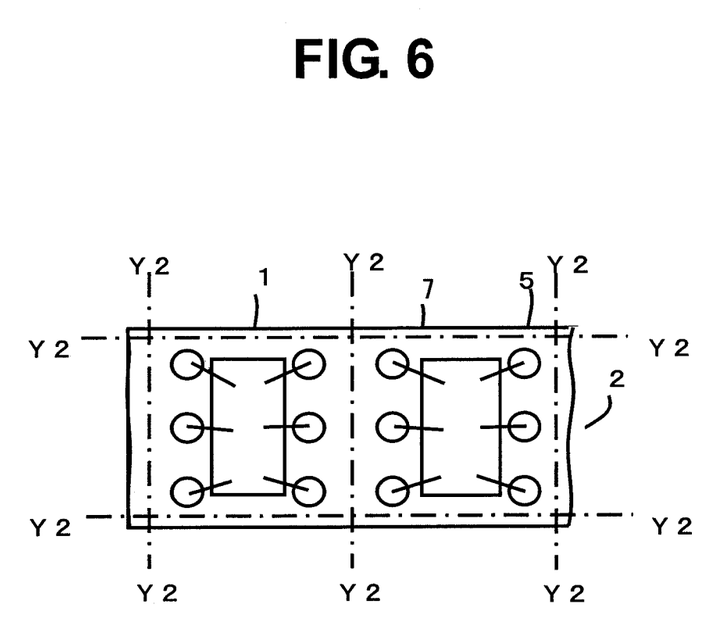
FIG. 6 is a top view of a resin encapsulation member.

Next, as illustrated in FIG. 5A, the semiconductor device 1 and the micro balls 5 are electrically connected to each other. The connection is performed by a wire bonding method using a gold wire, a copper wire, or an aluminum wire. Here, a gold wire of 20 μm is used, and the semiconductor device 1 and the micro balls 5 are electrically connected to each other by a thermosonic bonding method.

Figure 5B:
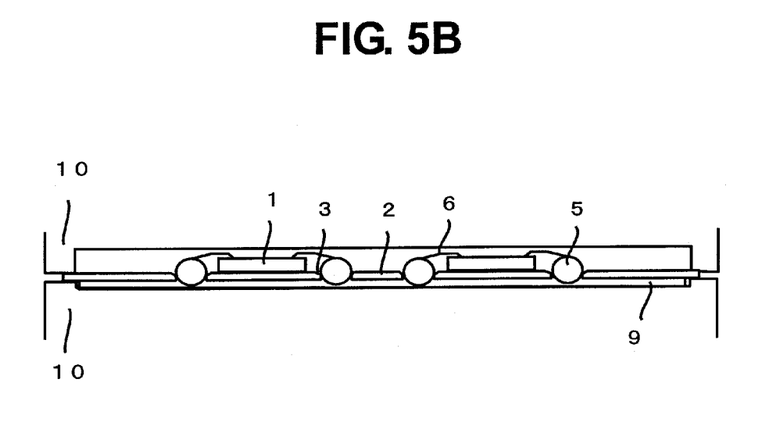
Figure 5C:
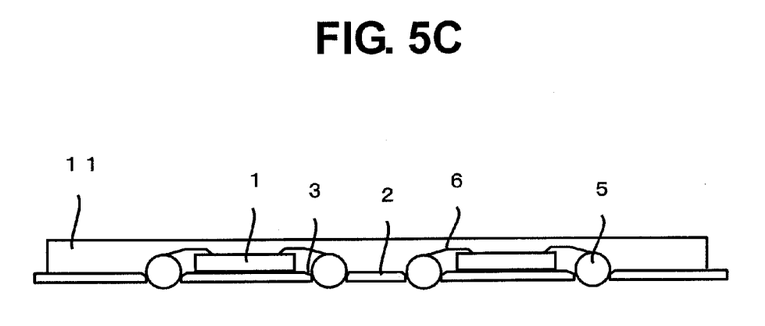

Next, as illustrated in FIG. 5B, in an encapsulation mold 10, the substrate 2 which has finished its wire bonding process is disposed, and only the upper surface side of the substrate 2 is encapsulated with the encapsulation resin 11. Here, the encapsulation is performed by a transfer molding method. When the encapsulation with resin is performed, a potting method may be employed. FIG. 5C is a view illustrating the encapsulation member after the resin encapsulation. Further, instead of the encapsulation resin, a hollow body made of a ceramics or a glass material may be fitted.

Figure 7:
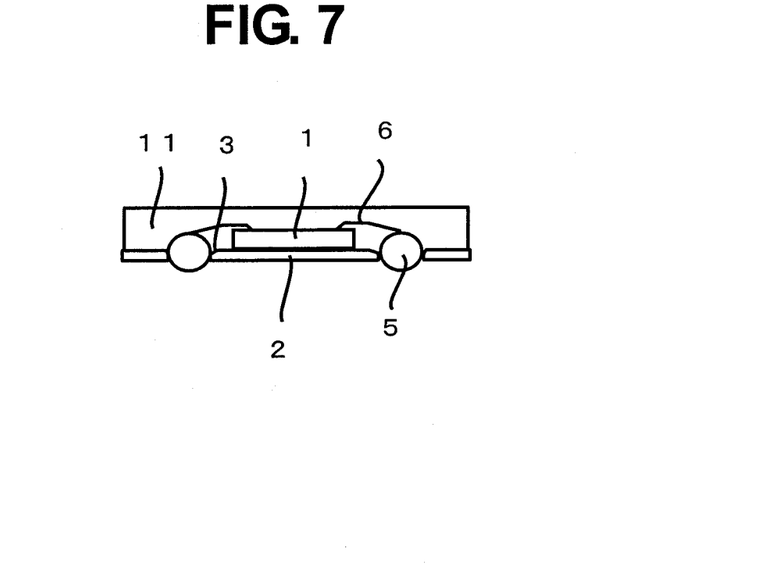
FIG. 7 is a cross-sectional view of the BGA semiconductor package according to the embodiment of the present invention.

Next, curing processing of the resin is performed as necessary, and by a dicing method, Y2-Y2 portions of the top view of the resin encapsulation member illustrated in FIG. 6 are cut to form individual pieces of the BGA semiconductor packages. An electrical characteristics test of the semiconductor device 1 is performed under the state where the encapsulation member is cut into the individual pieces of the BGA semiconductor packages or under the state of the encapsulation member. With the manufacturing method described above, the BGA semiconductor package according to the present invention is completed. FIG. 7 illustrates a cross-sectional structural view of the completed BGA semiconductor package.

Note that, in this embodiment, the micro balls as the external connection terminals are disposed only on both sides of the semiconductor device. However, it is apparent that the micro balls may be disposed on four sides of the semiconductor device so as to surround the semiconductor device, and it is needless to say that this form is within the scope of the present invention.

What is claimed is:

1. A BGA semiconductor package, comprising:
    a semiconductor device;
    a substrate on which the semiconductor device is mounted;
    an adhesive for adhering the semiconductor device and the substrate to each other;
    a micro ball having conductivity, the micro ball having a part fitted into a through-hole provided in the substrate;
    a bonding wire for electrically connecting the semiconductor device and the micro ball to each other; and
    an encapsulation member for encapsulating, with an encapsulation resin, the semiconductor device, the adhesive, a part of the micro ball which is not fitted into the through-hole, and the bonding wire, only on a surface side of the substrate on which the semiconductor device is mounted,
    at least a part of a bottom surface of the micro ball having an exposed portion as an external connection terminal, exposed through the through-hole provided in the substrate which forms a bottom surface of the encapsulation member.

2. A BGA semiconductor package according to claim 1, wherein the substrate is made of an insulator of any one of a resin, a glass epoxy, a ceramics, and a glass.

3. A BGA semiconductor package according to claim 1, wherein the through-hole provided in the substrate has a cylindrical shape.

4. A BGA semiconductor package according to claim 3, wherein the through-hole provided in the substrate has a diameter smaller than a diameter of the micro ball.

5. A BGA semiconductor package according to claim 1, wherein the substrate has a thickness smaller than a diameter of the micro ball.

6. A BGA semiconductor package according to claim 1, wherein the through-hole provided in the substrate, into which the micro ball is inserted, is disposed on one of each of both sides of the semiconductor device and each of four sides surrounding the semiconductor device.

7. A BGA semiconductor package according to claim 1, wherein the through-hole provided in the substrate has an end surface subjected to one of chamfering and tapering.

8. A BGA semiconductor package according to claim 1, wherein a material of the micro ball comprises one of a single metal material selected from solder, gold, silver, copper, aluminum, and palladium and a multilayer metal material using a plurality of metals selected from solder, gold, silver, copper, aluminum, and palladium.

9. A BGA semiconductor package according to claim 1, wherein:
    a center portion (core) of the micro ball is formed of a resin material having elasticity; and
    the micro ball comprises one of a composite micro ball in which an outer periphery portion of the resin material having the elasticity is covered with a single metal material selected from solder, gold, silver, copper, aluminum, and palladium, and a composite micro ball in which the outer periphery portion of the resin material having the elasticity is covered with a multilayer metal material using a plurality of metals selected from solder, gold, silver, copper, aluminum, and palladium.

10. A BGA semiconductor package according to claim 1, wherein the micro ball has an upper surface height higher than an upper surface of the semiconductor device fixed to a die pad.

11. A BGA semiconductor package according to claim 1, wherein the micro ball has an upper surface height lower than an upper surface of the semiconductor device fixed to a die pad.

12. A BGA semiconductor package according to claim 1, wherein the bonding wire comprises any one of metal wires including a gold wire, a copper wire, and an aluminum wire.

13. A BGA semiconductor package according to claim 1, wherein the micro ball has a diameter which is 5 μm or larger and 500 μm or smaller.

\* \* \* \* \*